(12) United States Patent
Yokozawa

(10) Patent No.: US 7,180,112 B2
(45) Date of Patent: Feb. 20, 2007

(54) SOLID-STATE IMAGING APPARATUS HAVING AN UPWARDLY CONVEX COLOR FILTER LAYER AND METHOD OF MANUFACTURING THE SAME

(75) Inventor: Kenji Yokozawa, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/989,002

(22) Filed: Nov. 16, 2004

(65) Prior Publication Data

US 2005/0116269 A1 Jun. 2, 2005

(30) Foreign Application Priority Data

Nov. 28, 2003 (JP) .............................. 2003-398544

(51) Int. Cl.
*H01L 31/06* (2006.01)
(52) U.S. Cl. ...................... 257/294; 257/213; 257/288; 257/290; 257/291; 257/E31.121; 438/48; 438/57; 438/69; 438/70
(58) Field of Classification Search ..................... None
See application file for complete search history.

(56) References Cited

U.S. PATENT DOCUMENTS

| 5,453,611 | A | | 9/1995 | Oozu et al. |
| 5,801,373 | A | | 9/1998 | Oozu et al. |
| 6,030,852 | A | * | 2/2000 | Sano et al. |
| 6,255,640 | B1 | * | 7/2001 | Endo et al. |
| 6,362,513 | B2 | * | 3/2002 | Wester |
| 2002/0079504 | A1 | * | 6/2002 | Kim |

FOREIGN PATENT DOCUMENTS

| JP | 03-283666 | 12/1991 |
| JP | 06-217079 | 8/1994 |
| JP | 07-122720 | 5/1995 |
| JP | 2000-354133 | 12/2000 |
| JP | 2001-249218 | 9/2001 |

\* cited by examiner

*Primary Examiner*—Nathan J. Flynn
*Assistant Examiner*—Kevin Quinto
(74) *Attorney, Agent, or Firm*—Wenderoth, Lind & Ponack, L.L.P.

(57) ABSTRACT

In a solid-state imaging apparatus, a plurality of pixel units are arranged, the pixel units including (i) a photoelectric conversion element formed above a semiconductor substrate and (ii) a color filter layer formed above the photoelectric conversion element. In each color filter layer, the central part is formed thicker than the peripheral part.

16 Claims, 3 Drawing Sheets

SOLID-STATE IMAGING APPARATUS HAVING AN UPWARDLY CONVEX COLOR FILTER LAYER AND METHOD OF MANUFACTURING THE SAME

BACKGROUND OF THE INVENTION (1) Field of the Invention

The present invention relates to a solid state imaging apparatus including an on-chip color filter, and to a method of manufacturing the same.

(2) Description of the Related Art

In recent years, a solid-state imaging apparatus such as a Charge Coupled Device (CCD) has been miniaturized and the number of pixels of the solid-state imaging apparatus has been increased. However, since the conventional solid-state imaging apparatus including an on-chip color filter has a reduced light-receiving size of a photodiode which is a light-receiving sensor unit, a photoelectric conversion characteristic (light sensitivity) which is a main characteristic of the solid-state imaging apparatus is reduced.

For example, the optical size of a solid-state imaging apparatus mounted in a digital still camera is mainly from one-third inch to one-fourth inch, and one-sixth inch and smaller sizes are being examined. Also, the number of pixels is expanding to the range of two million pixels to five million pixels, and five million pixels or more are being examined. Considering the above mentioned reduced light-receiving size and increased number of pixels, it is necessary to establish a technique which prevents the main characteristics of the solid-state imaging apparatus, from being reduced, such as light sensitivity, mixed colors with the neighboring pixels, and line gradation.

FIG. 1 is a cross-section view of a pixel of the solid-state imaging apparatus disclosed in Japanese Laid-Open patent publication No. 2001-249218. According to the above mentioned solid-state imaging apparatus, (i) the first semiconductor well region 2 which is a second conductive type (for example, P-type) is formed on a semiconductor substrate 1 made of a first conductive type (for example, N-type) silicon semiconductor and (ii) an N-type semiconductor region for making each light-receiving sensor unit 3 of matrix arrangement is formed above the first P-type semiconductor well region 2.

Moreover, via a gate insulating film 4, a transfer electrode 5 made of, for example, polysilicon is formed. Then, via an inter-layer insulating film 6 covering the transfer electrode 5, a photo-shielding film 7 made of AL, W and the like is formed above the overall plane except for the aperture of the light-receiving sensor unit 3. After that, the photo-shielding film 7 is covered with a passivation film 8.

Furthermore, a first clear flat film 9, color filter layers 10G and 10B, and a second clear flat film 11 are sequentially formed. Then, an on-chip microlens 12 which condenses incident light into each light-receiving sensor unit 3 is formed above the flat film 11.

The first clear flat film 9 is a film for eliminating difference in level on the foundation so as to form a stable color filter layer. The second clear flat film 11 is a film for flattening the color filter layers 10G and 10B so as to accurately form the on-chip micro lens 12.

The color filter layers 10G and 10B include: (i) a color filter made of complementary colors such as yellow, cyan, magenta and green (solely, or made by laminating yellow and cyan), or (ii) a color filter made of the primary colors such as red, green and blue, and the like.

The conventional color filter layer is formed by (i) a staining method and (ii) a color resisting method which selects and exposes, to light, a photoresist film including stain and dye and executes a developing process so as to form an intended filter.

According to the improved example as disclosed in the above mentioned Japanese Laid-Open patent publication No. 2001-249218, as measures to avoid (i) decrease in light sensitivity, and (ii) mixed colors between the neighboring pixels which are both caused by a diagonal light, it is essential to make the distance from the semiconductor substrate surface to the second clear flat film 11 short, due to the miniaturization. As such means, making the complementary green filter thin is suggested because the complementary green filter formed by laminating cyan and yellow has a high possibility to be the thickest among the color filter layers.

As such example, in a color filter manufacturing method, the color filter film which has the first color component and does not include any photosensitive materials is selectively etched and formed. Thus, for example, in manufacturing a complementary color filter, if a green filter component is formed using the above mentioned one color method, the green filter component can be formed with the similar thin film thickness to the other color filter components. Therefore, the color filter layer can be made thin.

According to the conventional solid-state imaging apparatus, for the reduced pixel size, measures to make the distance from the semiconductor substrate to the second clear flat film 11 short is suggested. And, some effects are expected regarding the vertical incident light falling into the light-receiving sensor unit 3. However, regarding the diagonal light, due to the shapes of the color filter layers 10G and 10B, the diagonal incident light penetrates the neighboring color filter layers, and falls into the light-receiving sensor unit 3. Thus, colors are mixed, and the necessary spectral characteristic can not be obtained. Moreover, depending on the incident angle of the light, the degree of the mixed colors changes, and problems such as line gradation and sensitivity unevenness are yet to be solved.

SUMMARY OF THE INVENTION

The object of the present invention is to provide a solid-state imaging apparatus and a manufacturing method thereof, for which by improving the shape of each color filter layer, (i) mixed colors of the neighboring color filter layers, line gradation, sensitivity unevenness are reduced, and (ii) miniaturization can be achieved.

In order to achieve the above mentioned object, the solid-state imaging apparatus according to the present invention comprises a plurality of arranged pixel units, each of the pixel units including a photoelectric conversion element formed above a semiconductor substrate, and a color filter layer formed above the photoelectric conversion element, wherein in each color filter layer, a central part is thicker than a peripheral part. Thus, the effect of the diagonal light on the neighboring color filters is reduced. As a result, (i) mixed colors can be avoided, (ii) line gradation can be improved, and (iii) sensitivity unevenness can be reduced.

The color filter layer may include (i) a first color filter layer formed using a smaller dimension than a dimension of each pixel unit, and (ii) a second color filter layer formed using the same dimension as said each pixel unit, the first and second color filter layers being laminated.

The first color filter layer and the second color filter layer are formed using the same material so as to make a uniform lens structure.

Also, the first color filter and the second color filter have different dye concentrations. By adjusting the dye concentrations, spectral characteristics of the diagonal incident light and vertical incident light can be harmonized so as to avoid color shading.

In addition, a first clear film is placed between the photoelectric conversion element and the color filter layer, and the color filter layer has a higher refractive index than a refractive index of the first clear film.

Moreover, a second clear film is placed on the color filter layer, and the second clear film has a lower refractive index than a refractive index of the color filter layer.

Furthermore, a microlens is placed on the second clear film, and the microlens has a higher refractive index than a refractive index of the second clear film.

According to the above mentioned structure, the light-condensing effect of the lens can be improved.

Also, the solid-state imaging apparatus may have a structure in which a convex-shaped micro lens is placed, via the second clear flat film 11, on the color filter.

According to the above mentioned structure, in addition to the lens effect of the color filter layer, by placing the microlens on top, the light-condensing rate can be improved so as to improve the sensitivity.

Here, it is preferable that the microlens has a higher refractive index than a refractive index of the color filter layers.

According to the above mentioned structure, light can be condensed gradually and effectively using the two-tier microlenses. Thus, the sensitivity can be improved.

Also, a method is provided for manufacturing a solid-state imaging apparatus in which a plurality of pixel units are arranged, each of the pixel units including a photoelectric conversion element formed above a semiconductor substrate, and a color filter layer formed above the photoelectric conversion element, the method comprising: a process of forming a first layer as a part of the color filter layer, using a smaller dimension than a dimension of each pixel unit; and a process of forming, on the first layer, a second layer as a part of the color filter layer, using the same dimension as the dimension of each pixel unit.

Moreover, using the same mask, (i) the first color filter layer which is smaller than the pixel unit can be formed by performing exposure to light in the under exposure region, and (ii) the second color filter layer can be exposed to light in the appropriate or over exposure region, so as to form a laminated color filter layer.

As described above, according to the solid-state imaging apparatus of the present invention, by forming the color filter layer so that the central part is thicker than the peripheral part, the effect of the diagonal light on the neighboring color filter layers is reduced. Consequently, (i) mixed colors can be avoided, (ii) line gradation can be improved, and (iii) sensitivity unevenness can be reduced.

Also, by making a laminated structure in which each color filter layer is formed by dividing each color filter layer into two layers, the peripheral part is made thinner than the central part. Thus, the convex-shaped lens can be realized on top.

Moreover, by adding color gradation in the central part and peripheral part, spectroscopies of a diagonal light and a front light can be matched, and color shading can be reduced.

FURTHER INFORMATION ABOUT TECHNICAL BACKGROUND TO THIS APPLICATION

The disclosure of Japanese Patent Application No. 2003-398544 filed on Nov. 28, 2003 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

<Configuration of a Solid-State Imaging Apparatus>

Figure 1:
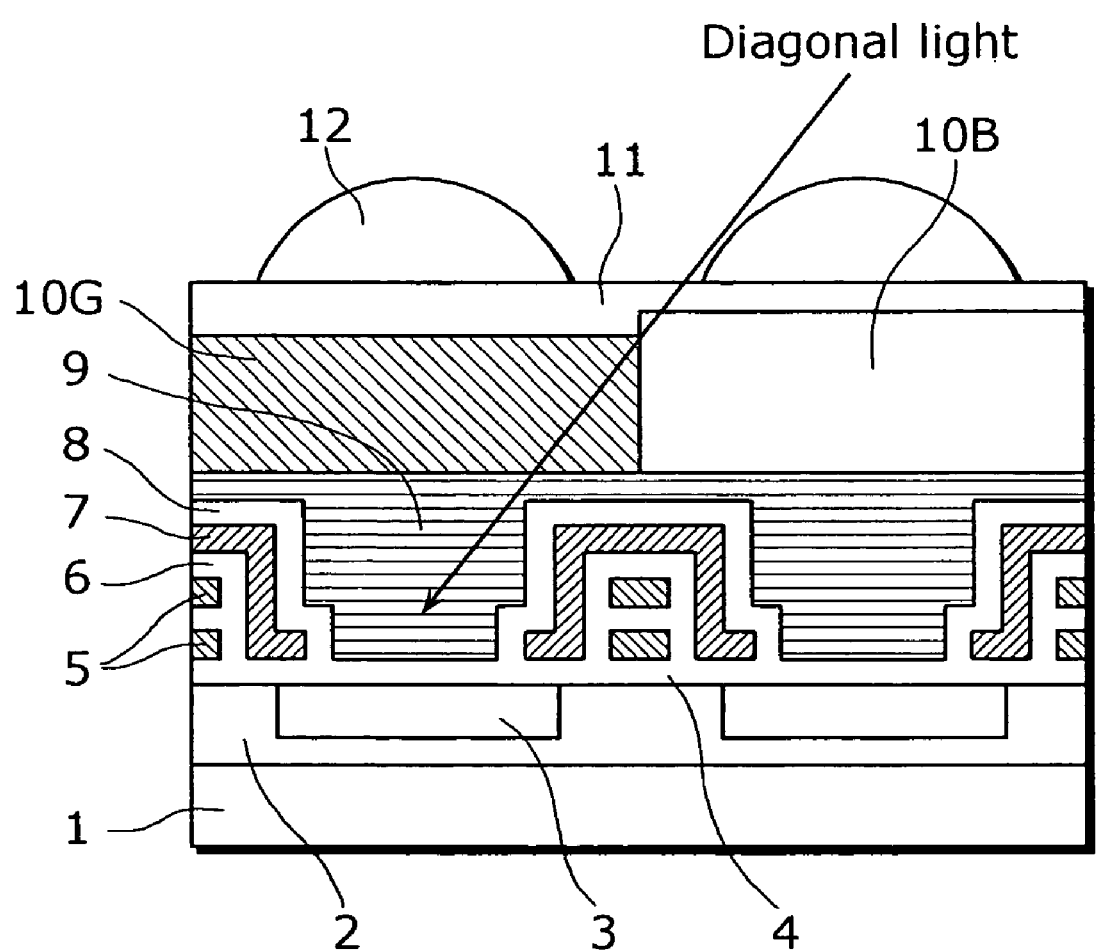
FIG. 1 is a cross-section view of the solid-state imaging apparatus according to the conventional technique.
Figure 2:
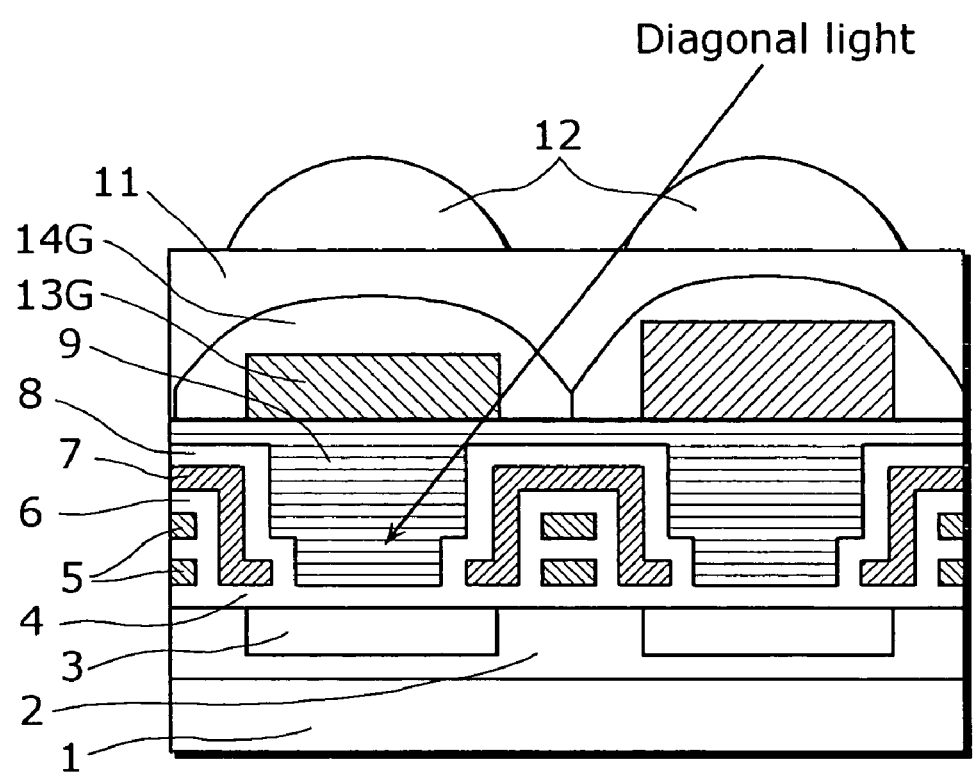
FIG. 2 is a diagram showing a cross-section of the pixel unit of the solid-state imaging apparatus according to the embodiment example of the present invention.

FIG. 2 is a diagram showing the cross-section structure of the solid-state imaging apparatus according to an embodiment of the present invention. FIG. 2 shows the cross-section of one photoelectric conversion element.

According to the above mentioned solid-state imaging apparatus, (i) the first semiconductor well region 2 of the second conductive type (P type) is formed above the semiconductor substrate 1 of the first conductive type (for example N type), and (ii) an N type semiconductor region for making each light-receiving sensor unit 3 of matrix arrangement is formed above the first semiconductor well region 2.

In addition, via a gate insulating film 4, a transfer electrode 5 made of polysilicon is formed. A photo-shielding film 7 made of AL and the like is formed above the overall plane of the other parts except for the aperture of each light-receiving sensor unit 3. Moreover, a passivation film 8 made of SiON film and the like is formed.

There are concavities and convexities between the transfer electrode 5 and each light-receiving sensor unit 3. In order to accurately form a color filter layer 10 later, using a photosensitive clear film whose main component is phenolic resin and the like, the first clear flat film 9 is formed by means of coating, exposure to light, and developing process.

After that, using a mask generated with the smaller design than the pixel size, coating, exposure to light and developing are executed, and thereby the first color filter layer 13G which is smaller than the pixel size is generated. Consecutively, under the coating conditions to make the coating film thinner than the first color filter layer 13G, after coating the same color filter material, using a mask designed with the same measurement as the pixel size, the second color filter layer 14G is formed. Thus, the color filter layer with the convex lens shape can be obtained on the laminated structure.

Furthermore, in order to accurately form an on-chip microlens 12 later, after coating a plurality of times and baking the clear film whose main component is acryl clear resin, the second clear flat film 11 is formed by etchback. And, the on-chip microlens 12 is formed by coating, exposure to light, and developing process.

Since the above mentioned color filter layer has a convex lens shape on top, for example, the diagonal incident light heading to the photo-shielding film 7 can be collected. Thereby, the light-condensing rate of the light-receiving plane of the light-receiving sensor unit 3 can be improved, and the sensitivity can be improved. Furthermore, the above mentioned color filter layer is not affected by the other color filter layers existing on the neighboring light-receiving sensor units, mixed colors can be avoided, and line gradation and color shading can be reduced regarding the diagonal incident light.

<Manufacturing Process of a Solid-State Imaging Apparatus>

Figure 3:
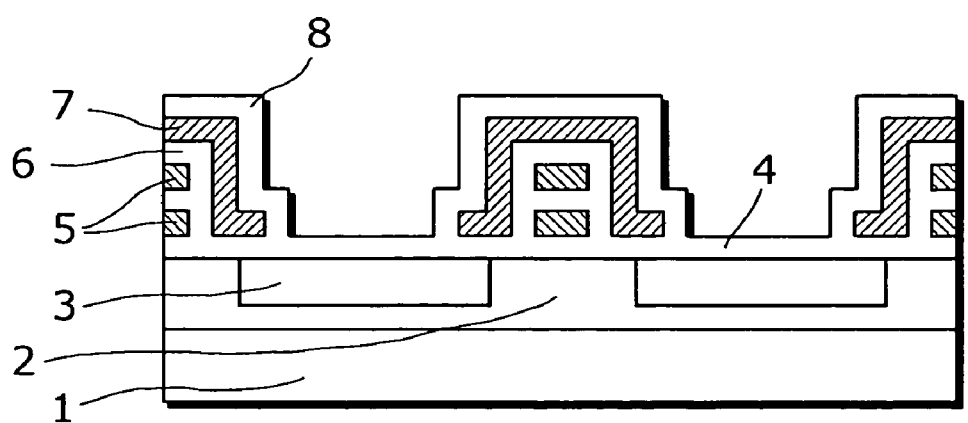
FIG. 3 is a cross-section view showing a manufacturing process of the solid-state imaging apparatus according to the embodiment example of the present invention following FIG. 2.

The method for manufacturing a solid-state imaging apparatus as shown in FIG. 2 will be explained using FIG. 3, FIG. 4, FIG. 5 and FIG. 2. FIG. 3 and FIG. 2 are diagrams showing the cross-sections of the solid-state imaging apparatus in the order of the main manufacturing process.

FIG. 3 is a cross-section view in which up to a passivation film 8 is formed above an N-type semiconductor substrate 1. The manufacturing process leading to the cross-section view as shown in FIG. 3 will be explained in the following (1) to (4).

(1) A P-type well layer 2 and an N-type diffusion layer (light-receiving sensor unit 3) which are on an N-type semiconductor substrate 1 are formed generally by repeating a photolithography process, an ion implantation process, and a thermal diffusion process.

(2) After that, after a gate insulating film 4 is formed, a transfer electrode 5 made of conductive polysilicon, and a photo-shielding film 7 made of W and the like are formed.

(3) After that, a passivation film 8 made of BPSG film (boron-phospho-silicate glass) is formed by, for example, a thermal flow process.

(4) Moreover, after a wiring (not shown in the drawing) made of aluminum and the like is formed, for example, a SiON film and a bonding pad (not shown in the drawing) for extracting electrode are formed.

Figure 4:
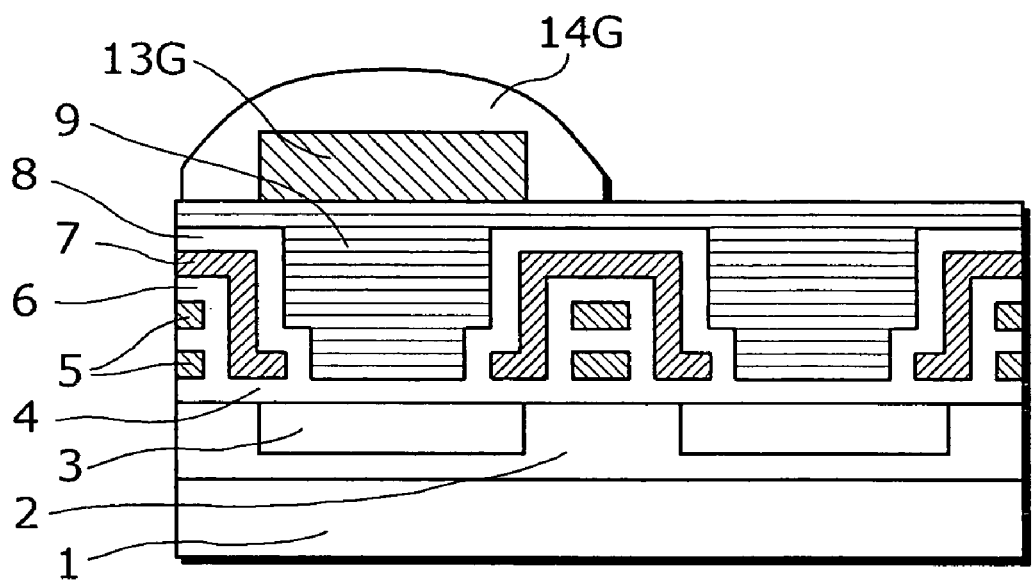
FIG. 4 is a cross-section view showing a manufacturing process of the solid-state imaging apparatus according to the embodiment example of the present invention following FIG. 3.

FIG. 4 shows a cross-section view leading to the formation of the green specific second color filter layer 14G. The manufacturing process leading to the cross-section as shown in FIG. 4 will be explained in the following (5) to (8).

(5) For example, a photosensitive clear resin whose main component is phenolic resin can be coated on a passivation film, and exposure to light and a developing process can be performed to fill the dent over a light-receiving sensor unit 3.

(6) After that, for example, (i) a thin film made of acrylic thermosetting clear resin is coated and thermal-hardened, or (ii) a Hexamethyldisilizane (HMDS) film is steam-coated. Then, the resist for forming the green light specific first color filter layer 13G is coated. In the above mentioned resist, stain or dye is mixed so as to selectively penetrate a light of green wavelength.

(7) Next, the coated color resist is exposed to light, and developed using a photomask designed to remain in a smaller part than the region where the green specific color filter layer is formed above the light-receiving sensor unit 3. For example, in the case where the region for forming the green specific color filter layer is a square pixel of 2 μm×2 μm, the first color filter layer 13G is formed to be about a square pixel of 1.5 μm×1.5 μm.

(8) Consecutively, the same color filter material is coated more thinly than the first color filter, and exposed to light and developed using a photomask designed as the same size (2 μm×2 μm square) as the light-receiving sensor unit 3 to form the second color filter layer 14G. Thereby, a green specific color filter layer is formed, the green specific color filter layer having a convex lens shape and a spectral characteristic for which the central part is more concentrated than the peripheral part.

Figure 5:
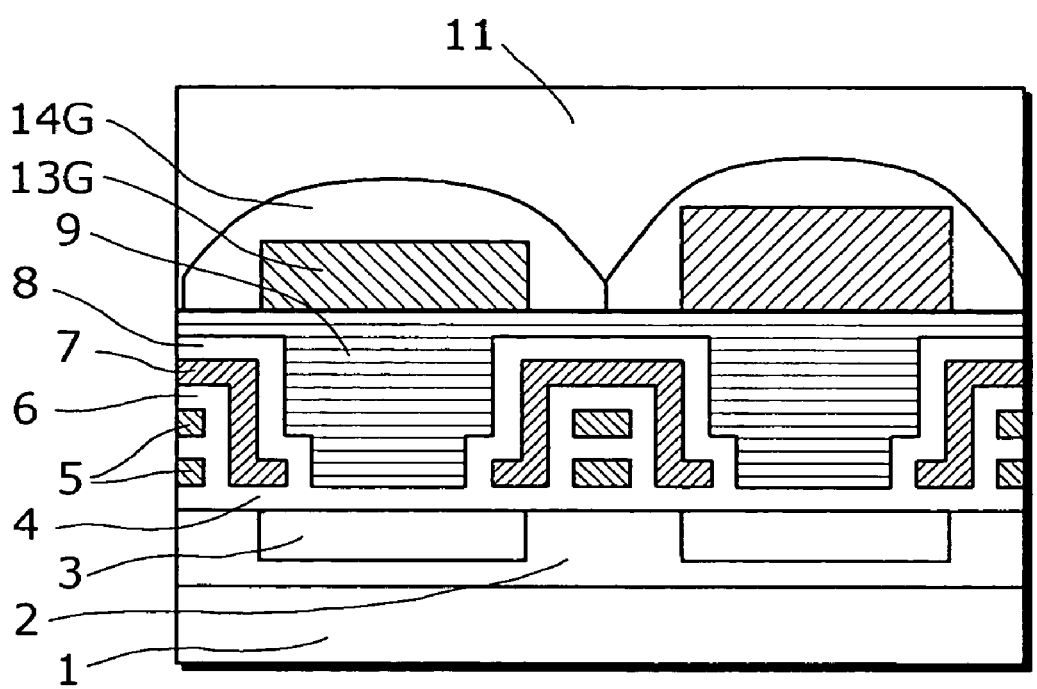
FIG. 5 is a cross-section view showing a manufacturing process of the solid-state imaging apparatus according to the embodiment example of the present invention following FIG. 4.

FIG. 5 shows a cross-section view in which after the green color filter is formed, a flat film before etchback is formed. The manufacturing process leading to the cross-section as shown in FIG. 5 will be explained in the following (9) and (10).

(9) After the green specific color filter layer is formed, using the similar method, a red specific color filter layer and a blue specific color filter layer are respectively formed in each predetermined location.

(10) On each color filter layer, for example, thermosetting clear resin whose main component is acrylic resin is coated a plurality of times, and thermosetting is repeated so as to flatten the surface after the color filter formation.

FIG. 2 further shows a cross-section view of a flat film formation after etchback, leading to a micro lens formation. The manufacturing process leading to the cross-section as shown in FIG. 2 will be explained in the following (11) and (12).

(11) In order to improve sensitivity, etching is executed making the thermosetting clear resin as thin as possible by the etchback method so as to make the distance from the light-receiving plane to the surface of each color filter layer short.

(12) After that, (i) on the light-receiving sensor unit 3, photosensitive clear resin whose main component is phenolic resin is coated, exposed to light, and developed, then (ii) a convex shaped on-chip micro lens 12 is formed above top.

The on-chip micro lens 12 has an improved penetration rate due to ultraviolet irradiation. Here, in order to avoid the deterioration of the spectral characteristic of the color filter layer, the process temperature needs to be set at 200 degrees or less. Also, the refractive index of the first clear flat film 9 needs to be made lower than the refractive index of the color filter layer. The refractive index of the second clear flat film 11 needs to be made lower than the refractive index of the color filter layer. And, the refractive index of the on-chip microlens 12 needs to be made higher than the refractive index of the second clear flat film 11.

The solid-state imaging apparatus as shown in FIG. 2 can be manufactured by the above mentioned process.

As described above, according to the solid-state imaging apparatus of the embodiment of the present invention, since the color filter layers are formed twice dividing into the first color filter layer and the second color filter layer, the color-filter layer of the top-convex-lens shape can be easily formed. As a result, mixed colors between the neighboring color filters caused by the diagonal light can be avoided. Thus, the solid-state imaging apparatus can obtain a fine image.

In addition, since the color filter layer has a top-convex-lens shape and a higher refractive index than the first flat film, the incident light can be effectively concentrated into the light-receiving sensor unit 3. As a result, the sensitivity can be improved.

Moreover, the film thickness in the periphery of the color filter layer can be made thin. The color filter layer can be accurately formed above the light-receiving sensor unit 3, and color shading per each pixel can be avoided. As a result, line gradation and color shading of the solid-state imaging apparatus can be improved.

Also, the spectroscopy is weaker in the peripheral part than the central part of the color filter layer. Compared to the conventional structure, the amount of the penetrating light from the peripheral part of the color filter layer increases. As a result, the improved sensitivity of the solid-state imaging apparatus can be expected.

In addition, the refractive index of the second clear flat film 11 formed above the color filter film is lower than the color filter layer of the top-convex-lens shape. And, the light-condensing into the color filter becomes effective. Thus, the improved sensitivity can be expected.

Moreover, the refractive index of the on-chip micro lens 12 formed above the second clear flat film 11 is higher than the second flat film. And, the incident light falling into the micro lens can be effectively condensed into the light-receiving sensor unit. As a result, the sensitivity can be improved.

Here, as a means to form a clear flat film under the color filter layer, there are: (i) a method for coating a clear film, performing exposure to light and developing so as to fill in the concave of the foundation surface, (ii) a method for coating a clear film a plurality of times, and flattening the film by the etchback, (iii) a method for coating a clear film, and flattening the film by a thermal flow process, and (iv) a method for combining the above mentioned processes and improving the flatness.

As a method for forming the color filter layers twice, (i) after coating the first color filter layer, the film is exposed to light using a mask made of smaller patterns than the pixel size, then the film is developed to form the first color filter layer, and (ii) after coating a color filter layer using the same material with the same thickness as the first color filter layer or less, the film is exposed to light using a mask which is equal to the pixel size, then the film is developed to form the second color filter layer. As a result, the color filter layer having necessary spectroscopy can be obtained.

In the case where the second color filter layer is formed, the dye concentration may be changed from the first color filter layer. For example, the second color filter layer may be formed with less dye concentration than the first color filter layer.

According to the above mentioned manufacturing method, the solid-state imaging apparatus having the above mentioned structure, function and effect can be manufactured.

As described above, the solid-state imaging apparatus and manufacturing method according to the embodiment of the present invention has been explained. However, the present invention is not limited to the present embodiment, and can be changed to different variations within the range of the same effect.

For example, as an example of the color filter layer, the primary color method has been explained, the method being used on the solid-state imaging apparatus for which color tone is the most important. However, a complementary color method may be used, the method being used on the solid-state imaging apparatus for which resolution and sensitivity are the most important. In the case of the complementary color method, as the color filter layer, the magenta light specific color filter layer, the green light specific color filter layer, the yellow light specific color filter layer, and the cyan light specific color filter layer are respectively formed in the predetermined location in the color arrangement.

Also, as the material for forming the color resist layer, there are color resist including stain, color resist including dye, and the like. One of the above mentioned choices may be selected.

The photography technique using the photosensitive clear resin has been explained for the formation of the first clear flat film 9. However, there is the etchback method for forming the first clear flat film 9 by coating the thermosetting resin material a plurality of times, and repeating the thermosetting.

In addition, after the formation of the first flat film, the thermosetting clear resin whose main component is acrylic resin or HMDS film which are employed so as to strengthen the adhesion to the color resist material can be omitted, if the adhesion intensity is assured.

Moreover, according to the above mentioned embodiment, the solid-state imaging apparatus has been explained as CCD type. However, the present invention can be applied to a Metal Oxide Semiconductor (MOS) type and other solid-state imaging apparatuses.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be placed within the scope of this invention.

INDUSTRIAL APPLICABILITY

The present invention is suitable for a solid-state imaging apparatus comprising: a plurality of photoelectric converters formed above the semiconductor substrate; a transfer electrode formed in the periphery of the plurality of photoelectric converters; a color filter layer formed above the plurality of photoelectric converters; and a microlens formed above the color filter layer.

What is claimed is:

1. A solid-state imaging apparatus in which a plurality of pixel units are arranged, each of said pixel units comprising:
    a photoelectric conversion element formed above a semiconductor substrate; and
    a color filter layer formed above said photoelectric conversion element,
    wherein a central part of said color filter layer is higher than a peripheral part of said color filter layer,
    wherein said color filter layer includes (i) a first layer formed using a smaller dimension than a dimension of each of said pixel units, and (ii) a second layer formed using the same dimension as each of said pixel units, wherein said first layer and said second layer are laminated.

2. The solid-state imaging apparatus according to claim 1 wherein said first layer and said second layer are formed using the same material.

3. The solid-state imaging apparatus according to claim 1 wherein said first layer and said second layer have different dye concentrations.

4. The solid-state imaging apparatus according to claim 2 wherein a first clear film is disposed between said photoelectric conversion element and said color filter layer, and
wherein said color filter layer has a higher refractive index than a refractive index of said first clear film.

5. The solid-state imaging apparatus according to claim 4 wherein a second clear film is disposed on said color filter layer, and
wherein said said second clear film has a lower refractive index than a refractive index of said color filter layer.

6. The solid-state imaging apparatus according to claim 5 wherein a microlens is disposed on said second clear film, and
wherein said microlens has a higher refractive index than a refractive index of said second clear film.

7. The solid-state imaging apparatus according to claim 5, wherein a microlens is disposed on said second clear film, and
wherein said the microlens has a higher refractive index than a refractive index of said color filter layer.

8. A solid-state imaging apparatus in which a plurality of pixel units are arranged, each of said pixel units comprising:
a photoelectric conversion element formed above a semiconductor substrate; and
a color filter layer formed above said photoelectric conversion element,
wherein a central part of said color filter layer is thicker than a peripheral part of said color filter layer,
wherein the said color filter layer includes (i) a first layer formed using a smaller dimension than a dimension of each of said pixel units, and (ii) a second layer formed using the same dimension as said each of said pixel units, and
wherein said first layer and said second layer are laminated.

9. The solid-state imaging apparatus according to claim 8, wherein said first layer and said second layer are formed using the same material.

10. The solid-state imaging apparatus according to claim 8, wherein said first layer and said second layer have different dye concentrations.

11. The solid-state imaging apparatus according to claim 9,
wherein a first clear film is disposed between said photoelectric conversion element and said color filter layer, and
wherein said color filter layer has a higher refractive index than a refractive index of said first clear film.

12. The solid-state imaging apparatus according to claim 11,
wherein a second clear film is disposed on said color filter layer, and
wherein said second clear film has a lower refractive index than a refractive index of said color filter layer.

13. The solid-state imaging apparatus according to claim 12,
wherein a microlens is disposed on said second clear film, and
wherein said microlens has a higher refractive index than a refractive index of said second clear film.

14. The solid-state imaging apparatus according to claim 12,
wherein a microlens is disposed on said second clear film, and
wherein said microlens has a higher refractive index than a refractive index of said color filter layer.

15. A method for manufacturing a solid-state imaging apparatus in which a plurality of pixel units are arranged, each of said pixel units including a photoelectric conversion element formed above a semiconductor substrate, and a color filter layer formed above the photoelectric conversion element, the method comprising:
forming a first layer as a part of the color filter layer, using a smaller dimension than a dimension of each of said pixel units; and
forming, on the first layer, a second layer as a part of the color filter layer, using the same dimension as the dimension of each of said pixel units.

16. The method for manufacturing a solid-state imaging apparatus according to claim 15,
wherein the first layer and the second layer are formed by performing different exposures to light using the same mask.

* * * * *